(12) United States Patent
Kang et al.

(10) Patent No.: US 7,592,624 B2
(45) Date of Patent: Sep. 22, 2009

(54) ORGANIC LIGHT EMITTING DISPLAY INCLUDING A PROTRUDING INSULATING LAYER AND METHOD OF FABRICATING THE SAME

(75) Inventors: Tae-Wook Kang, Seongnam-si (KR); Yu-Sung Cho, Jeollanam-do (KR); Sang-Won Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 64 days.

(21) Appl. No.: 11/121,992

(22) Filed: May 5, 2005

(65) Prior Publication Data

US 2005/0263755 A1 Dec. 1, 2005

(30) Foreign Application Priority Data

May 27, 2004 (KR) .................. 10-2004-0037964

(51) Int. Cl.
*H01L 31/00* (2006.01)
(52) U.S. Cl. .......................... 257/59; 257/72
(58) Field of Classification Search .............. 257/40, 257/59, 72
See application file for complete search history.

(56) References Cited

U.S. PATENT DOCUMENTS

| | | | |
|---|---|---|---|
| 6,597,121 B2 * | 7/2003 | Imura .................. | 315/169.3 |
| 7,129,637 B2 * | 10/2006 | Nakayama ................. | 313/506 |
| 2001/0002703 A1 * | 6/2001 | Koyama ................. | 257/40 |
| 2002/0179908 A1 * | 12/2002 | Arao .................. | 257/72 |
| 2002/0197778 A1 * | 12/2002 | Kasahara et al. ............ | 438/166 |
| 2003/0059986 A1 * | 3/2003 | Shibata .................. | 438/149 |
| 2003/0157754 A1 * | 8/2003 | Yamazaki et al. ........... | 438/162 |
| 2003/0164496 A1 * | 9/2003 | Do et al. .................. | 257/40 |
| 2004/0051445 A1 * | 3/2004 | Adachi .................. | 313/504 |
| 2004/0079941 A1 * | 4/2004 | Yamazaki et al. ............. | 257/40 |
| 2005/0110011 A1 * | 5/2005 | Im et al. .................. | 257/40 |
| 2005/0285100 A1 * | 12/2005 | Jeong et al. ................. | 257/40 |

* cited by examiner

*Primary Examiner*—Kenneth A Parker
*Assistant Examiner*—Anthony Ho
(74) *Attorney, Agent, or Firm*—H.C. Park & Associates, PLC (57) ABSTRACT

An organic light emitting display and method of fabricating the same are provided, such that an organic light emitting display includes a substrate having formed thereon a thin film transistor including a gate electrode, a source electrode, and a drain electrode, a passivation layer formed on the substrate having a contact hole exposing the source or the drain electrode, a first insulating layer pattern formed on a portion of the passivation layer corresponding to an emission region and having a step portion that is higher than the passivation layer on the thin film transistor, a pixel electrode formed on a portion of the passivation layer and on a portion of the first insulating layer pattern that contacts the source or the drain electrode through the contact hole, and a second insulating layer pattern formed on portions of the passivation layer and the pixel electrode that defines the emission region.

12 Claims, 7 Drawing Sheets

ORGANIC LIGHT EMITTING DISPLAY INCLUDING A PROTRUDING INSULATING LAYER AND METHOD OF FABRICATING THE SAME

CROSS-REFERENCE TO RELATED APPLICATION

This application claims priority to and the benefit of Korean Patent Application No. 2004-37964, filed May 27, 2004, which is incorporated by reference for all purposes as if fully set forth herein.

BACKGROUND OF THE INVENTION

1. Field of the Invention

The present invention relates to an organic light emitting display and method of fabricating the same and, more particularly, to an organic light emitting display and method of fabricating the same in which a subsequent organic layer is deposited by forming an insulating layer pattern having a protruding structure and then forming a pixel electrode in an emission region.

2. Description of the Related Art

An organic light emitting display (OLED) is an emissive display that emits light by electrically exciting a fluorescent organic compound. The OLED is classified into a passive matrix type and an active matrix type according to how the driving N×M pixels are arranged in the matrix. The active matrix OLED consumes less power than the passive matrix OLED making it more suitable for a large-sized display and/or a high resolution display. Also, the OLED is classified into a top emission type, a bottom emission type, and a double-sided emission type based on a direction of light emitted from the organic compound. The top emission OLED emits light in an opposite direction to a substrate having unit pixels and has a high aperture ratio.

The organic compound of the OLED is formed in an emission region of a pixel electrode, which is an anode. A laser induced thermal imaging (LITI) technique or a small molecule deposition technique may be used to form the organic compound.

Figure 1A:
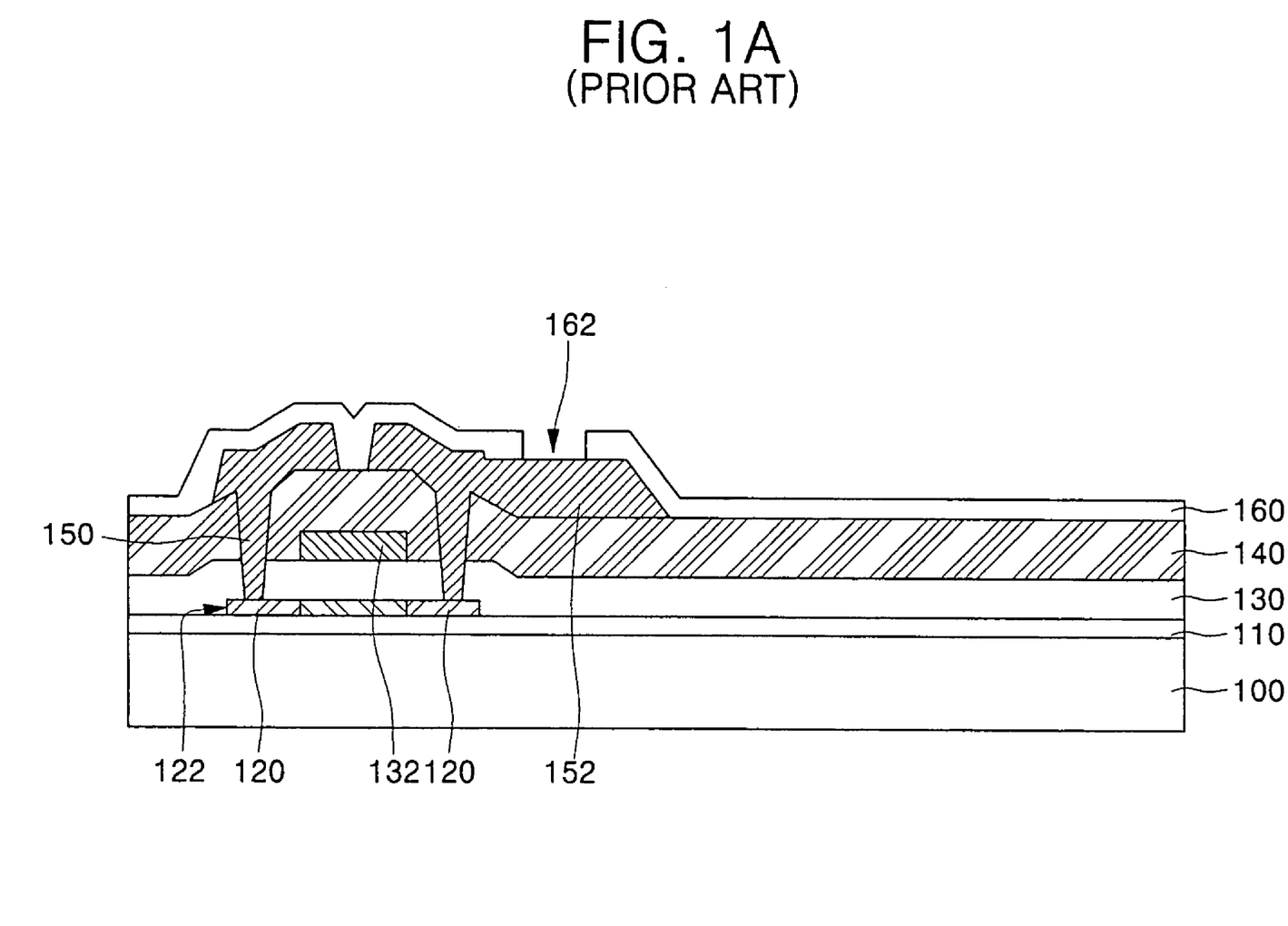
FIGS. 1A, 1B, and 1C are cross-sectional views illustrating a method of fabricating a conventional organic light emitting display.
Figure 1B:
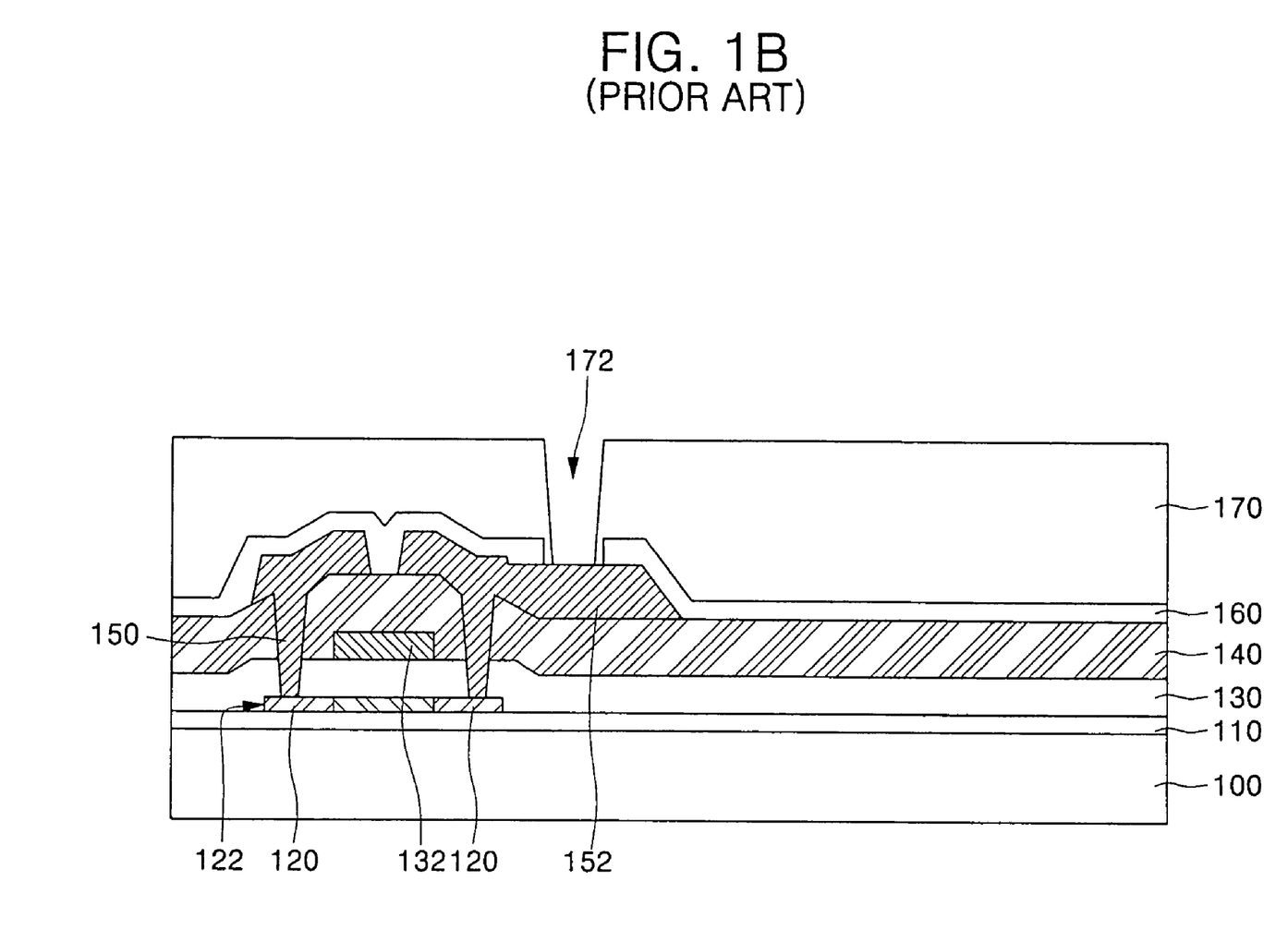
Figure 1C:
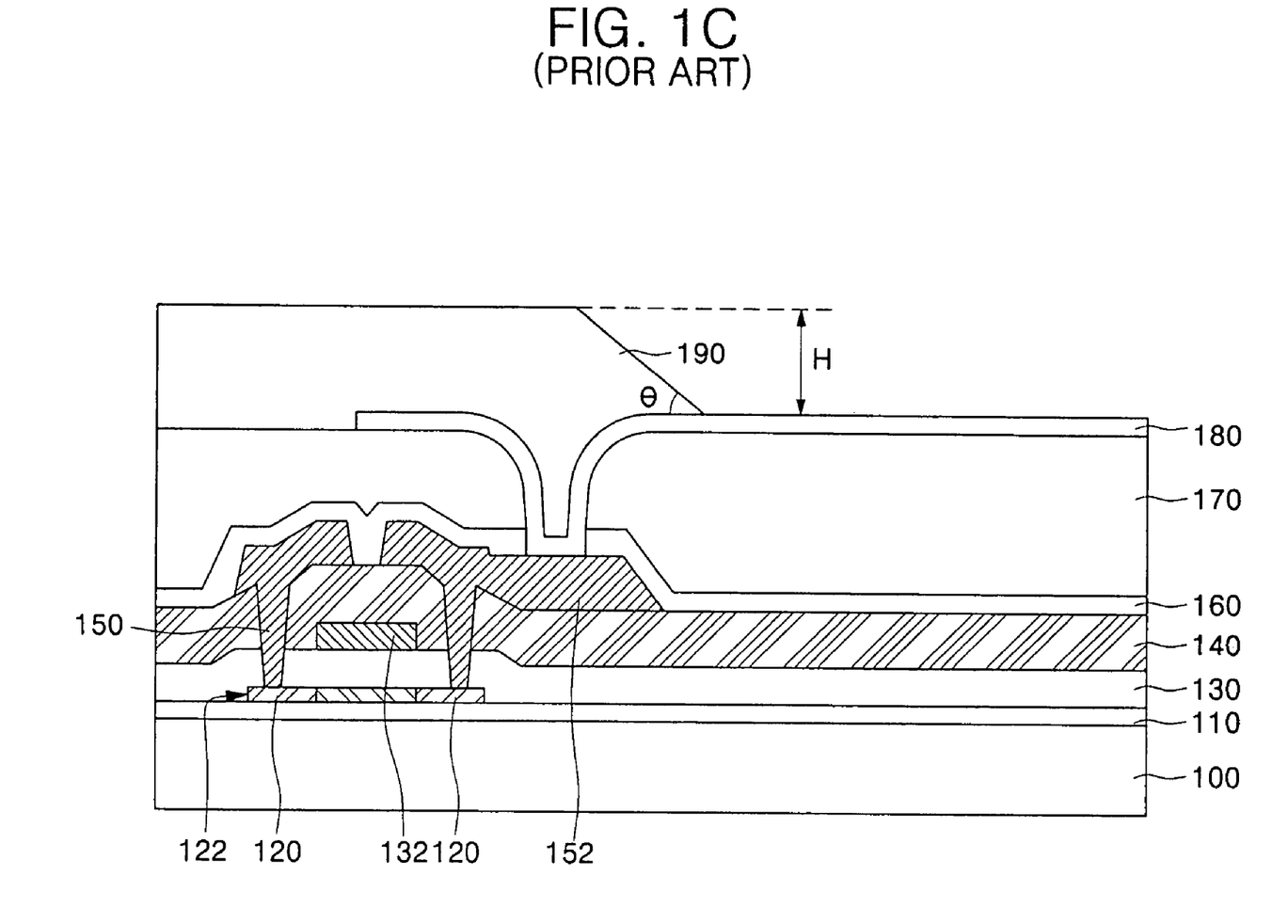

FIGS. 1A, 1B, and 1C are cross-sectional views illustrating a method of fabricating a conventional OLED. Each of FIGS. 1A, 1B, and 1C illustrates a different stage of fabrication.

Referring to FIGS. 1A, 1B, and 1C, a buffer layer 110 having a predetermined thickness is formed on a substrate 100, and a thin film transistor (TFT) having a polysilicon pattern 122, a gate electrode 132, and source and drain electrodes 150 and 152 are formed thereon. For example, source and drain regions 120, which are ion-implanted, are formed at both sides of the polysilicon pattern 122, and a gate insulating layer 130 is formed over the entire surface including the polysilicon pattern 122.

A passivation layer 160 having a predetermined thickness is formed over the entire surface of the structure and is etched by photolithography and etching processes to form a first via contact hole 162 which exposes the source electrode 150 or the drain electrode 152. The passivation layer 160 may be formed of silicon nitride. Referring to FIG. 1A, the contact hole 162 exposes a portion of the drain electrode 152.

Referring to FIG. 1B, a first insulating layer 170 is formed over the entire surface of the structure for planarization of a pixel region. The first insulating layer 170 may be made of, for example, polyimide, benzocyclobutene-based resin, spin on glass (SOG), or acrylate. The first insulating layer 170 is etched by a photolithography process to form a second contact hole 172 which exposes at least a portion of the first contact hole 162.

Referring to FIG. 1C, a pixel electrode material layer (not shown) is subsequently formed over the entire surface of the structure. The pixel electrode material layer is made of a transparent conductive material, such as, for example, indium tin oxide (ITO). The pixel electrode material layer is etched by a photolithography process to form a pixel electrode 180. A second insulating layer pattern 190 is subsequently formed over the entire surface of the structure to define a pixel region of the pixel electrode 180. The second insulating layer pattern 190 may be made of polyimide, benzocyclobutene-based resin, phenol resin, or acrylate. An organic layer (not shown) and a cathode (not shown) are subsequently formed using the LITI technique or the small molecule deposition technique, thereby completing the OLED.

As shown in FIG. 1C, when the second insulating layer 190 has a thickness sufficient to fill a contact hole, a step H with a height of at least 5,000 Å is formed between the second insulating layer pattern 190 and the pixel electrode 180 and a portion of the second insulating layer pattern 190 corresponding to an edge of the pixel region forms an angle $\theta$ of approximately 50°. Therefore, an edge or portion of an organic layer that is formed by the LITI technique may be separated or removed from a surface of the structure, thereby degrading the characteristics of the OLED.

SUMMARY OF THE INVENTION

The present invention, therefore, solves at least the problems discussed above associated with conventional devices by providing an organic light emitting display (OLED) and a method of fabricating the same in which a subsequent organic layer may be easily formed by forming an insulating layer pattern in a pixel region and then protruding an emission region of the pixel electrode. According to an embodiment of the invention, there is provided an organic light emitting display including a substrate having formed thereon a thin film transistor including a gate electrode, a source electrode, and a drain electrode, a passivation layer formed on the substrate having a contact hole exposing the source electrode or the drain electrode, a first insulating layer pattern formed on a portion of the passivation layer corresponding to an emission region and having a step portion that is higher than the passivation layer on the thin film transistor, a pixel electrode formed on a portion of the passivation layer and on a portion of the first insulating layer pattern that contacts the source electrode or the drain electrode through the contact hole, and a second insulating layer pattern formed on a portion of the passivation layer and on a portion of the pixel electrode that defines the emission region.

According to another embodiment of the invention, there is provided an organic light emitting display including a substrate having formed thereon a thin film transistor including a gate electrode, a source electrode, and a drain electrode, a first insulating layer formed on the substrate having a contact hole exposing the source electrode or the drain electrode and having a portion that protrudes in an emission region, a pixel electrode formed on the first insulating layer that contacts the source electrode or the drain electrode through the contact hole, and a second insulating layer pattern formed on a portion of the first insulating layer and on a portion of the pixel electrode that defines the emission region.

According to still another embodiment of the invention, there is provided a method of fabricating an organic light emitting display, including forming a passivation layer on a substrate having formed thereon a thin film transistor including a gate electrode, a source electrode, and a drain electrode, forming a contact hole in the passivation layer that exposes the source electrode or the drain electrode by etching the passivation layer via a photolithography process, forming a first insulating layer on the passivation layer, forming a pattern on the first insulating layer having a protruding structure in an emission region by etching the first insulating layer via a photolithography process, forming a pixel electrode contacting the source electrode or the drain electrode through the contact hole, and forming a second insulating layer pattern on a portion of the passivation layer and on a portion of the pixel electrode that defines the emission region.

According to yet another embodiment of the invention, there is provided a method of fabricating an organic light emitting display, including forming a first insulating layer on a substrate having formed thereon a thin film transistor including a gate electrode, a source electrode, and a drain electrode, etching the first insulating layer via a photolithography process using a semitransparent mask to form a contact hole that exposes the source electrode or the drain electrode, etching a predetermined thickness of the first insulating layer of the thin film transistor to form a protruding portion of the first insulating layer corresponding to an emission region, forming a pixel electrode that contacts the source electrode or the drain electrode through the contact hole, and forming a second insulating layer pattern on a portion of the first insulating layer and on a portion of the pixel electrode that defines the emission region.

According to yet still another embodiment of the invention, there is provided a method of forming a second insulating layer on a substrate of an organic light emitting diode, including forming a first insulating layer that protrudes in an emission region, forming a pixel electrode on the first insulating layer, and forming the second insulting layer on portions of the first insulating layer and the pixel electrode such that a step having a height of approximately 3,000 Å or less is formed between the second insulating layer and a top height of the pixel electrode in the emission region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to the embodiments of the present invention, examples of which are illustrated in the accompanying drawings, wherein like reference numerals refer to like elements throughout. The embodiments are described below to explain the present invention by referring to the figures.

Figure 2A:
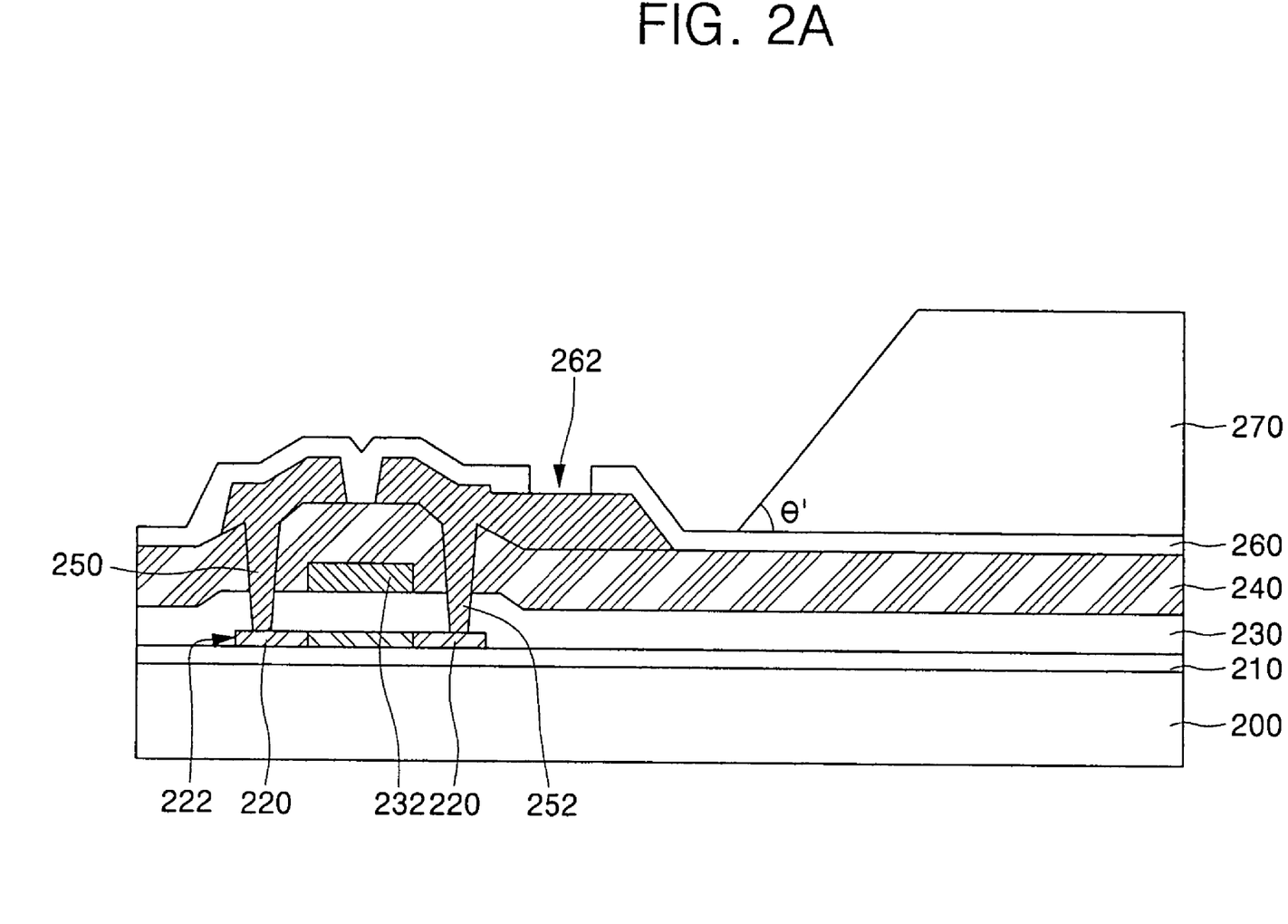
FIGS. 2A and 2B are cross-sectional view illustrating a method of fabricating an organic light emitting display according to an embodiment of the invention.
Figure 2B:
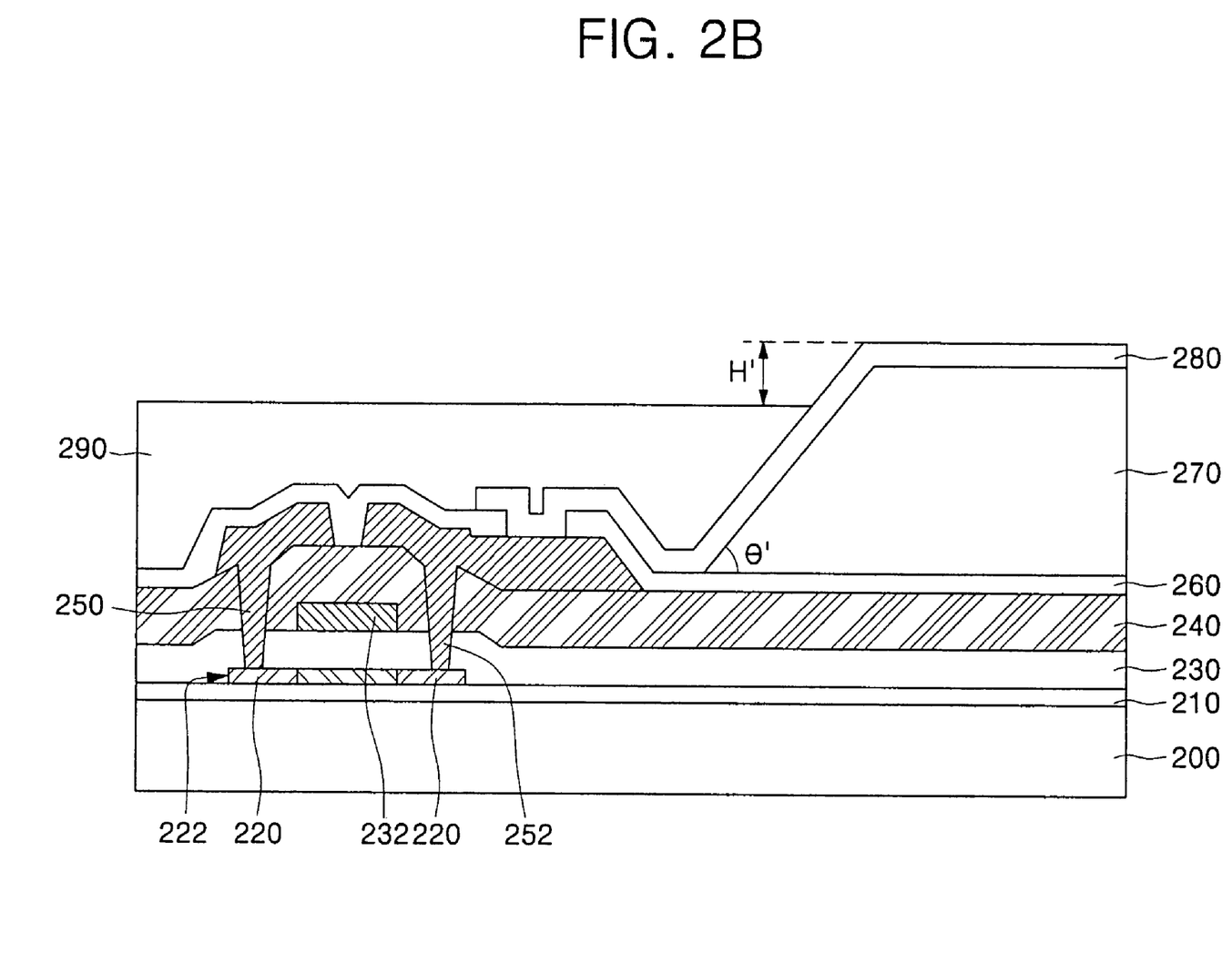

FIGS. 2A and 2B are cross-sectional view illustrating a method of fabricating an organic light emitting display (OLED) according to an embodiment of the invention.

As shown in FIG. 2B, the OLED includes a substrate 200 having a thin film transistor formed thereon, wherein the thin film transistor includes a gate electrode 232 and source and drain electrodes 250 and 252, a passivation layer 260 having a contact hole 262 exposing one of the source and drain electrodes 250 and 252, a first insulating layer pattern 270 formed on a portion of the passivation layer 260 corresponding to an emission region, a pixel electrode 280 formed on the passivation layer 260 and the first insulating layer pattern 270 to contact one of the source and drain electrodes 250 and 252 through the contact hole 262, and a second insulating layer pattern 290 formed on portions of the passivation layer 260 and the pixel electrode 280 to define an emission region. The first insulating layer pattern 270 is formed such that it is higher than the thin film transistor region, and is tapered with the passivation layer 260 at an angle θ' ranging from approximately 10° to 50°. The second insulating layer pattern 290 is formed having a sufficient thickness to planarize or cover the thin film transistor region. Further, the second insulating layer pattern 290 has a height difference H' of approximately 3,000 Å or less with respect to a surface of the pixel electrode 280 of the emission region. It is understood that the step H' is approximately 3,000 Å in either vertical direction, i.e., upward or downward, with respect to the surface of the pixel electrode 280.

Referring to FIGS. 2A and 2B, a method of fabricating the OLED of the invention is described below.

A buffer layer 210 having a predetermined thickness is formed on a substrate 200 using a plasma-enhanced chemical vapor deposition (PECVD) technique. The substrate 200 is made of, for example, glass, quartz, sapphire, etc., and the buffer layer 210 is made of, for example, silicon oxide. The buffer layer 210 prevents impurities in the substrate 200 from diffusing during a crystallization process of an amorphous silicon layer (not shown) that is formed thereon.

An amorphous silicon layer (not shown) having a predetermined thickness is deposited or formed on the buffer layer 210. The amorphous silicon layer (not shown) is crystallized through, for example, an excimer laser annealing (ELA) technique, a sequential lateral solidification (SLS) technique, a metal induced crystallization (MIC) technique, a metal induced lateral crystallization (MILC) technique, or the like, and a pattern is formed on the amorphous silicon layer by a photolithography and etching processes thereby forming a polysilicon pattern 222 in a thin film transistor region of the OLED. The polysilicon pattern 222 includes source and drain regions 220.

A gate insulating layer 230 having a predetermined thickness is subsequently formed over an entire surface of the structure. The gate insulating layer 230 may be made of, for example, silicon oxide or silicon nitride.

A metal layer (not shown) is subsequently formed on the gate insulating layer 230 as a gate electrode material layer. According to an embodiment of the invention, the metal layer may be formed of a single layer of aluminum (Al) or an aluminum alloy, such as aluminum-neodymium (AlNd), or a multi-layer in which an aluminum alloy is provided on, for example, chromium (Cr) or molybdenum (Mo). The metal layer is subsequently etched by a photolithography process to form a gate electrode 232. End portions of the polysilicon pattern 222, which are not covered by the gate electrode 232, are each implanted with impurity ions to form source and drain regions 220.

An interlayer insulating layer 240 having a predetermined thickness is subsequently formed over the entire surface of the structure. The interlayer insulating layer 240 is made of, for example, silicon nitride.

Contact holes exposing the source and drain regions 220 are subsequently formed by etching the interlayer insulating layer 240 and the gate insulating layer 230 by a photolithography process. Source and drain electrodes 250 and 252, which contact the source and drain regions 220, respectively, are subsequently formed by depositing an electrode material layer over the entire surface of the structure, including inside the contact holes, and etching the electrode material layer by a photolithography process. The electrode material layer may be made of, for example, molybdenum-tungsten (MoW) or aluminum-neodymium (AlNd).

A passivation layer 260 is subsequently formed on the entire surface of the structure by depositing a silicon nitride layer to a predetermined thickness or height over the entire surface of the structure. The passivation layer 260 is etched by a photolithography process to form a contact hole 262, which exposes one of the source and drain electrodes 250 and 252, for example, as shown in FIG. 2A, the drain electrode 252.

A first insulating layer (not shown) is subsequently formed over the entire surface of the structure. The first insulating layer is formed having a thickness sufficient to planarize the thin film transistor region. The first insulating layer (not shown) is made of, for example, polyimide, benzocyclobutene-based resin, spin on glass (SOG), or acrylate.

The first insulating layer is subsequently etched by a photolithography process to form a first insulating layer pattern 270 on a pixel region of the substrate 200. The first insulating layer pattern 270 preferably forms a taper angle θ' of approximately 10° to 50° with the passivation layer 260.

A pixel electrode material layer is subsequently formed over the entire surface of the structure. When the OLED structure is a top emission structure, the pixel electrode material layer is a transparent metal electrode layer having a reflecting layer. When the OLED structure is a bottom emission structure, the pixel electrode material layer is a transparent metal electrode, such as indium tin oxide (ITO). The pixel electrode material layer is subsequently etched by a photolithography and etching processes to form a pixel electrode 280. The pixel electrode 280 contacts one of the source and drain electrodes 250 and 252 through the contact hole 262, for example, as shown in FIG. 2B, the drain electrode 252. The pixel electrode 280 has a structure which protrudes or extends in an emission region.

A second insulating layer (not shown) is subsequently formed over the entire surface of the structure. The second insulating layer is blanket etched to form a second insulating layer pattern 290, which defines a pixel region. Here, the second insulating layer pattern 290 is formed having a thickness or height that is sufficient to planarize the thin film transistor region. Further, the second insulating layer pattern 290 may be formed to include a step H' having a height difference of approximately 3,000 Å from a top height of the pixel electrode 280. It is understood that the height difference of step H' is approximately 3,000 Å in either vertical direction with respect to the surface of the pixel electrode 280. According to the above described embodiment of the invention, an organic layer may be satisfactorily or sufficiently formed on the pixel electrode 280 during a subsequent process when the step between the pixel electrode 280 and the second insulating layer pattern 290 has a height difference of less than approximately 3,000 Å.

Figure 3A:
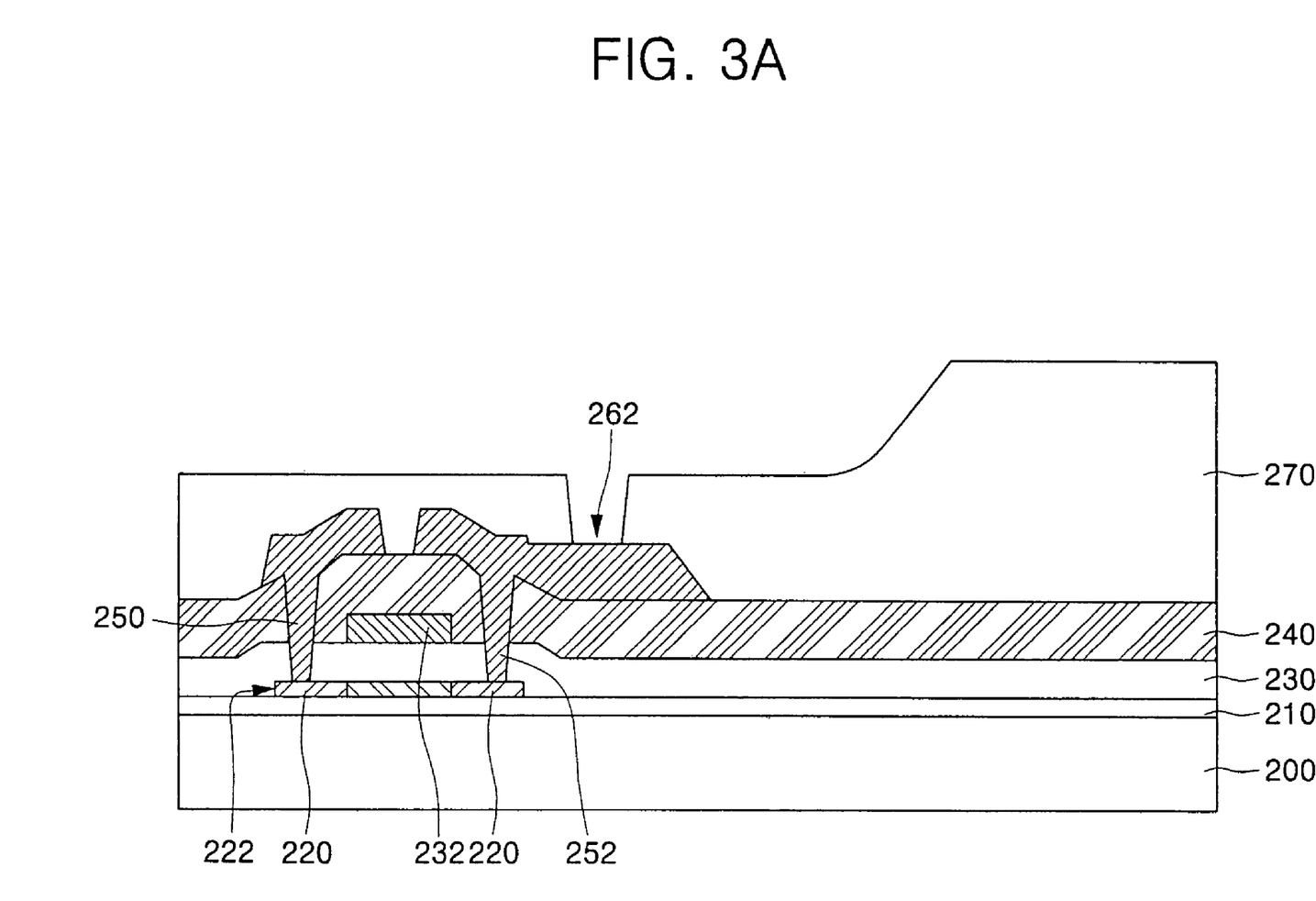
FIGS. 3A and 3B are cross-sectional view illustrating a method of fabricating an organic light emitting display according to another embodiment of the invention.
Figure 3B:
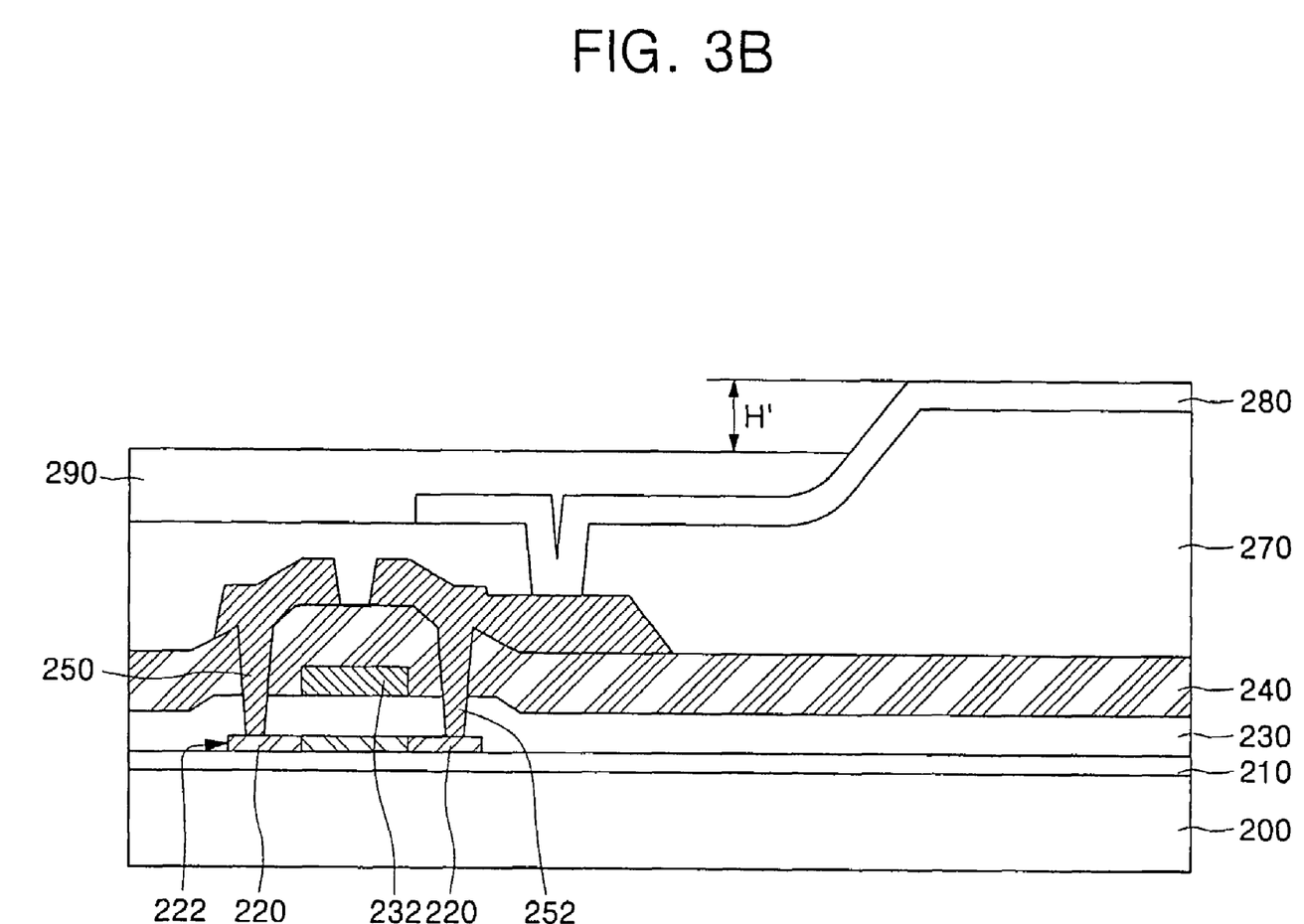

FIGS. 3A and 3B are cross-sectional view illustrating a method of fabricating an OLED according to another embodiment of the invention. Referring to FIG. 3B, the OLED includes a substrate 200 having a thin film transistor formed thereon, wherein the thin film transistor has a gate electrode 232 and source and drain electrodes 250 and 252 formed thereon, a first insulating layer 270 having a contact hole 262 formed thereon exposing one of the source and drain electrodes 250 and 252 and protruding or extending in an emission region, a pixel electrode 280 formed on the first insulating layer 270 and contacting one of the source and drain electrodes 250 and 252 through the contact hole 262, and a second insulating layer pattern 290 formed on a portion of the first insulating layer 270 and a portion of the pixel electrode 280 that defines an emission region.

The first insulating layer 270, which may be formed using a semitransparent mask, is formed in a higher position, i.e., above, the thin film transistor region. The second insulating layer pattern 290 is formed with sufficient thickness to planarize the thin film transistor region. Further, the second insulating layer pattern 290 may be formed to include a step H' having a height difference of approximately 3,000 Å from a top height of the pixel electrode 280 provided in the emission region. It is understood that the height difference of step H' is approximately 3,000 Å in either vertical direction, i.e., upward or downward, with respect to the top height of the pixel electrode 280.

A method of fabricating the OLED according to an embodiment of the invention is described below with reference to FIGS. 3A and 3B. Referring to FIGS. 3A and 3B, a buffer layer 210 having a predetermined thickness is formed on a substrate 200 using a plasma-enhanced chemical vapor deposition (PECVD) technique. The substrate 200 is made of, for example, glass, quartz, sapphire, etc., and the buffer layer 210 is made of, for example, silicon oxide. The buffer layer 210 prevents impurities in the substrate 200 from diffusing during a crystallization process of a subsequently formed amorphous silicon layer.

An amorphous silicon layer (not shown) having a predetermined thickness is deposited on the buffer layer 210, then crystallized using, for example, an excimer laser annealing (ELA) technique, an SLS technique, an MIC technique, or an MILC technique, and then patterned by a photolithography process to form a polysilicon pattern 222 in a TFT region of the substrate. Source and drain regions 220 are subsequently formed on the polysilicon pattern 222.

A gate insulating layer 230 having a predetermined thickness is subsequently formed over the entire surface of the structure. The gate insulating layer 230 may be made of silicon oxide or silicon nitride.

A metal layer (not shown) is formed on the gate insulating layer 230 as a gate electrode material layer. The metal layer may be formed of a single layer of aluminum (Al) or an aluminum alloy such as aluminum-neodymium (AlNd), or a multi-layer of aluminum (Al) or an aluminum alloy in which the aluminum or aluminum alloy is stacked on chromium (Cr) or molybdenum (Mo). The metal layer is subsequently etched by a photolithography process to form a gate electrode 232. End portions of the polysilicon pattern 222 that are not covered by the gate electrode 232 are implanted with impurity ions to form source and drain regions 220.

An interlayer insulating layer 240 having a predetermined thickness or height is subsequently formed over the entire surface of the structure. The interlayer insulating layer 240 may be made of silicon nitride.

The interlayer insulating layer 240 and the gate insulating layer 230 are etched by a photolithography process to form contact holes that expose the source and drain regions 220, respectively. An electrode material layer is subsequently formed over the entire surface of the structure, including the contact holes, and etched by a photolithography process to form source and drain electrodes 250 and 252, which contact with the source and drain regions 220, respectively. The electrode material layer may be made of molybdenum-tungsten (MoW) or aluminum-neodymium (AlNd).

A first insulating layer 270 is formed over the entire surface of the structure. For example, the first insulating layer 270 may be made of polyimide, benzocyclobutene-based resin, spin on glass (SOG), acrylate, or the like.

The first insulating layer 270 is etched by a photolithography process to form a contact hole 262 to expose one of the source and drain electrodes 250 and 252, for example, as shown in FIG. 3A, the drain electrode 252. Simultaneously, or substantially simultaneously, the first insulating layer 270 on the thin film transistor is recessed. The photolithography process forming the contact hole 262 may be performed using a semitransparent mask. The semitransparent mask has transmits light in a region of the contact hole, shields light in an emission region, and partially transmits light in other portions of the OLED, such as, as shown in FIG. 3A, the thin film transistor region.

A pixel electrode material layer is subsequently formed over the entire surface of the structure. When the OLED structure is a top emission structure, the pixel electrode material layer is a transparent metal electrode layer having a reflecting layer. When the OLED structure is a top emission structure, the pixel electrode material layer is formed of a transparent metal electrode, such as indium tin oxide (ITO). The pixel electrode material layer is etched by a photolithography process to form a pixel electrode 280. For example, the pixel electrode 280 may contact the drain electrode 252 of the source and drain electrodes 250 and 252 through the contact hole 262. It is understood that the pixel electrode 280 may instead contact the source electrode 250 through the contact hole 262. The pixel electrode 280 protrudes or extends in an emission region of the structure.

A second insulating layer (not shown) is subsequently formed over the entire surface of the structure. The second insulating layer is blanket etched to form a second insulating layer pattern 290 that defines a pixel region. The second insulating layer pattern 290 is formed having a sufficient thickness to planarize the thin film transistor region. Further, as shown in FIG. 3B, the second insulating layer pattern 290 may have a step H' of approximately 3,000 Å with respect to a surface of the pixel electrode 280. It is understood that the step H' is approximately 3,000 Å in either vertical direction, i.e., upward or downward, with respect to the surface of the pixel electrode 280.

According to at least the embodiments of the invention discussed above, a thickness of a second insulating layer, which defines an emission region, is more easily controlled by forming a first insulating layer and a pixel electrode that protrudes or extends in the emission region. Further, the reliability of the OLED may be improved since it is possible to prevent an organic layer, which is formed in a subsequent process, from being separated or removed from an edge of the pixel electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display comprising:
    a substrate having formed thereon a thin film transistor including a semiconductor layer, a gate electrode, a source electrode, and a drain electrode, the source electrode and the drain electrode being coupled with a source region and a drain region, respectively, of the semiconductor layer;
    a passivation layer formed on the substrate and having a contact hole exposing the source electrode or the drain electrode but not the source region or the drain region;
    a first insulating layer pattern formed on a portion of the passivation layer corresponding to an emission region and having a step portion that is higher than the passivation layer on the thin film transistor;
    a pixel electrode formed on a portion of the passivation layer and on a portion of the first insulating layer pattern, the pixel electrode contacting the source electrode or the drain electrode through the contact hole; and
    a second insulating layer pattern formed on a portion of the passivation layer and on a portion of the pixel electrode that defines the emission region,
    wherein the second insulating layer pattern is formed directly on the passivation layer.

2. The organic light emitting display of claim 1, wherein the second insulating layer pattern includes a step having a height difference of approximately 3,000 Å with respect to a top height of the pixel electrode.

3. The organic light emitting display of claim 2, wherein the step height of the second insulating layer pattern is controlled by a blanket etching process.

4. The organic light emitting display of claim 1, wherein the first insulating layer pattern is formed only in the emission region.

5. The organic light emitting display of claim 1, wherein the first insulating layer pattern does not cover the thin film transistor.

6. An organic light emitting display comprising:
    a substrate having formed thereon a thin film transistor including a gate electrode, a source electrode, and a drain electrode;
    a passivation layer formed on the substrate having a contact hole exposing the source electrode or the drain electrode;
    a first insulating layer pattern formed on a portion of the passivation layer corresponding to an emission region and having a step portion that is higher than the passivation layer on the thin film transistor;
    a pixel electrode formed on a portion of the passivation layer and on a portion of the first insulating layer pattern, the pixel electrode contacting the source electrode or the drain electrode through the contact hole; and
    a second insulating layer pattern formed on a portion of the passivation layer and on a portion of the pixel electrode that defines the emission region,
    wherein an edge of the first insulating layer pattern forms approximately a 10° to 50° angle with the passivation layer.

7. The organic light emitting display of claim 6, wherein the second insulating layer pattern includes a step having a height difference of approximately 3,000 Å with respect to a top height of the pixel electrode.

8. The organic light emitting display of claim 7, wherein the step height of the second insulating layer pattern is controlled by a blanket etching process.

9. An organic light emitting display comprising:
- a substrate having formed thereon a thin film transistor including a gate electrode, a source electrode, and a drain electrode;
- a first insulating layer formed on the substrate and having a contact hole exposing the source electrode or the drain electrode and having a portion that protrudes in an emission region such that an upper surface of the first insulating layer is not flat;
- a pixel electrode formed on the first insulating layer, the pixel electrode contacting the source electrode or the drain electrode through the contact hole; and
- a second insulating layer pattern formed directly on a portion of the first insulating layer and directly on a portion of the pixel electrode,
- wherein a top surface of the pixel electrode is disposed between the first insulating layer and the second insulating layer pattern.

10. The organic light emitting display of claim 9, wherein the contact hole and the protruded portion of the first insulating layer are formed by a photolithography and etching processes using a semitransparent mask.

11. The organic light emitting display of claim 9, wherein the second insulating layer pattern includes a step having a height difference of approximately 3,000 Å with respect to a top height of the pixel electrode.

12. The organic light emitting display of claim 11, wherein the step height of the second insulating layer pattern is controlled by a blanket etching process.

* * * * *